(12) United States Patent
Lee et al.

(10) Patent No.: US 12,069,845 B2
(45) Date of Patent: Aug. 20, 2024

(54) CONFORMAL ELECTROMAGNETIC INTERFERENCE SHIELDING FILM

(71) Applicant: Microsoft Technology Licensing, LLC, Redmond, WA (US)

(72) Inventors: Jaejin Lee, Redmond, WA (US); Bo Dan, Redmond, WA (US); Han Li, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 194 days.

(21) Appl. No.: 17/660,789

(22) Filed: Apr. 26, 2022

(65) Prior Publication Data

US 2023/0345687 A1 Oct. 26, 2023

(51) Int. Cl.
*H05K 9/00* (2006.01)
*H05K 1/02* (2006.01)
*H05K 3/28* (2006.01)

(52) U.S. Cl.
CPC ......... *H05K 9/0088* (2013.01); *H05K 1/0216* (2013.01); *H05K 3/284* (2013.01); *H05K 2203/1322* (2013.01)

(58) Field of Classification Search
CPC .... H05K 9/0088; H05K 1/0216; H05K 3/284; H05K 2203/1322
USPC .......................................................... 361/760
See application file for complete search history.

(56) References Cited

U.S. PATENT DOCUMENTS

| | | |
|---|---|---|
| 6,849,800 B2 | 2/2005 | Mazurkiewicz |
| 8,716,606 B2 | 5/2014 | Kelley et al. |
| 9,155,188 B2 | 10/2015 | Merz et al. |
| 9,222,735 B2 | 12/2015 | Hill et al. |
| 9,900,988 B1 | 2/2018 | Chao et al. |
| 9,949,359 B2 | 4/2018 | Chen et al. |
| 2010/0195291 A1 | 8/2010 | Aizawa et al. |
| 2010/0243313 A1 | 9/2010 | Ueda et al. |

(Continued)

FOREIGN PATENT DOCUMENTS

| | | |
|---|---|---|
| CN | 1697589 A | 11/2005 |
| CN | 113038811 A | 6/2021 |

(Continued)

OTHER PUBLICATIONS

Taranovich, Steve, "How to Shield Your 5G Systems from EMI", Retrieved From: https://www.electronicdesign.com/technologies/analog/article/21181685/electronic-design-how-to-shield-your-5g-systems-from-emi, Nov. 25, 2021, 9 Pages.

(Continued)

*Primary Examiner* — Andargie M Aychillhum
(74) *Attorney, Agent, or Firm* — Alleman Hall & Tuttle LLP (57) ABSTRACT

Provided is a conformal electromagnetic interference (EMI) shielding film including a thermal-forming film layer and an electrically conductive film layer. The thermal-forming film layer is configured to conformally coat over one or more electronic components mounted on a substrate with application of heat. The electrically conductive film layer is formed on an opposite side of the thermal-forming film layer from the substrate and has a plurality of voids that are configured to deform during the application of heat and allow the electrically conductive film layer to conform together with the thermal-forming film layer.

18 Claims, 5 Drawing Sheets

(56) References Cited

U.S. PATENT DOCUMENTS

| | | | |
|---|---|---|---|
| 2014/0098501 A1 | 4/2014 | Kawaguchi et al. | |
| 2016/0044839 A1 | 2/2016 | Akahane et al. | |
| 2019/0281734 A1* | 9/2019 | Seo ..................... | H05K 9/0088 |
| 2019/0320563 A1* | 10/2019 | Shen .................... | B32B 27/065 |

FOREIGN PATENT DOCUMENTS

| | | |
|---|---|---|
| JP | S6380599 A | 4/1988 |
| JP | 2021068884 A | 4/2021 |
| WO | 2021177138 A1 | 9/2021 |

OTHER PUBLICATIONS

Tome, Paul, "Flex Pcb Emi Shielding Methods and Materials", Retrieved From: https://blog.epectec.com/flex-pcb-emi-shielding-methods-and-materials, Mar. 26, 2018, 9 Pages.

"International Search Report and Written Opinion Issued in PCT Application No. PCT/US2023/012647", Mailed Date: May 25, 2023, 14 Pages.

* cited by examiner

CONFORMAL ELECTROMAGNETIC INTERFERENCE SHIELDING FILM

BACKGROUND

Modern electronic devices include various electronic components that emit electromagnetic fields. When properly controlled, these electronic components can interoperate without interfering with each other. However, there is a phenomenon, referred to as electromagnetic interference (EMI) or radio frequency interference (RFI), according to which the electromagnetic field from one component can affect another component.

SUMMARY

A conformal electromagnetic interference (EMI) shielding film is provided herein. The EMI shielding film may include a thermal-forming film layer and an electrically conductive film layer. The thermal-forming film layer may be configured to conformally coat over one or more electronic components mounted on a substrate with application of heat. The electrically conductive film layer may be formed on an opposite side of the thermal-forming film layer from the substrate and have a plurality of voids that are configured to deform during the application of heat and allow the electrically conductive film layer to conform together with the thermal-forming film layer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

As discussed above, EMI can impede the performance of an electronic device or a component thereof. EMI is a disturbance caused by an electromagnetic field and is often an unintended side effect of the normal operation of another electronic device or component. If an electronic device is susceptible to the influence of EMI, the interference can cause noise or otherwise impede the intended function of the electronic device.

High-speed interfaces such as Universal Serial Bus (USB), Double Data Rate 5 (DDR5) Synchronous Dynamic Random-Access Memory (SDRAM), and Peripheral Component Interconnect Express (PCIe) can cause radio desense, or receiver blocking, in nearby integrated antennas such as Long-Term Evolution (LTE), 5G, and Wi-Fi, causing the antennas to fail to receive properly signals that should be strong enough to be received normally. This can result in decreased user experience in the form of dropped calls, slow wireless speeds, short connection ranges, etc. As electronic devices are designed smaller and thinner, the proximity of EMI producers and EMI-sensitive devices decreases, which can increase EMI.

One way to protect vulnerable components from EMI is to add an electrically conductive shield such as a metal enclosure to confine the EMI to a small area. However, such a shield can block airflow, which is particularly undesirable when the device includes any heat generating components or heat sensitive components. For example, adding a shield to a processor may limit the performance of the processor. In addition, a handheld or wearable device such as a smartphone having such a shield may feel hot to the touch and be uncomfortable or worrying for a user of the device. To increase airflow in the presence of a shield, thermal vents may be installed in the chassis of the device, adding further design constraints. Alternatively, large holes may be formed in the shield, which may lower the effectiveness of the EMI shielding function. The enclosure, typically being boxlike and large enough to safely enclose the largest measurement in each dimension, may also increase the overall device size, weight, cost, and design complexity.

Figure 1:
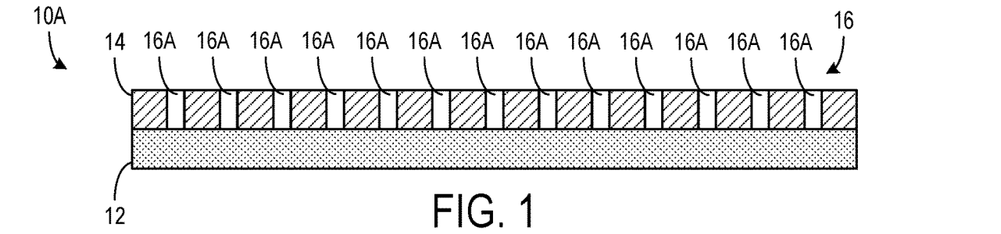
FIG. 1 shows a schematic cross-sectional view of a conformal electromagnetic interference (EMI) shielding film according to one example of the present disclosure.

To address the issues discussed above, FIG. 1 shows a schematic cross-sectional view of a conformal electromagnetic interference (EMI) shielding film 10A according to one example of the present disclosure. The state of the conformal EMI shielding film 10A in FIG. 1 is before the application of heat, when the conformal EMI shielding film 10A may be a substantially flat and flexible film. The conformal EMI shielding film 10A may include at least two layers, a thermal-forming film layer 12 and an electrically conductive film layer 14 layered in a stacking direction from bottom to top in FIG. 1. Typically the thermal-forming film layer 12 and electrically conductive film layer 14 are positioned directly adjacent each other with no intervening layer. Alternatively, an intervening layer, such as an adhesive layer, may be provided. The thermal-forming film layer 12 may be configured to deform with application of heat so as to conform to the shape of underlying components, whereas the electrically conductive film layer 14, which is responsible for the EMI shielding function of the conformal EMI shielding film 10A, may use the thermal-forming film layer 12 as a carrier so that both layers conform together during the application of heat. Accordingly, the electrically conductive film layer 14 may be quickly and easily made to conform to the shape of underlying components without being mold-formed to each individual underlying shape.

The thermal-forming film layer 12 may include at least one of polyethylene terephthalate, ethylene vinyl acetate, polyvinyl chloride, polystyrene, acrylonitrile butadiene styrene, acrylic, cellulose acetate butyrate, polycarbonate, polysulfone, or combinations thereof. Any of these materials may be suitable as a thermal-forming plastic that have a high thermal expansion coefficient and will become flexible when heated and set when cooled so that the conformal EMI shielding film 10A can easily be made to closely conform to the shape of underlying components, saving space in an electronic device housing the components. In addition, the thermal-forming film layer 12 may be electrically non-conductive so as to not cause any electrical issues such as shorts. The electrically conductive film layer 14 may include at least one of copper, aluminum, gold, silver, nickel, tin, zinc, magnesium, iron, or alloys thereof. These materials may exhibit suitable EMI shielding properties and be able to be formed thin enough to be moved by the thermally activated movement of the attached thermal-forming film layer 12.

Figure 2:
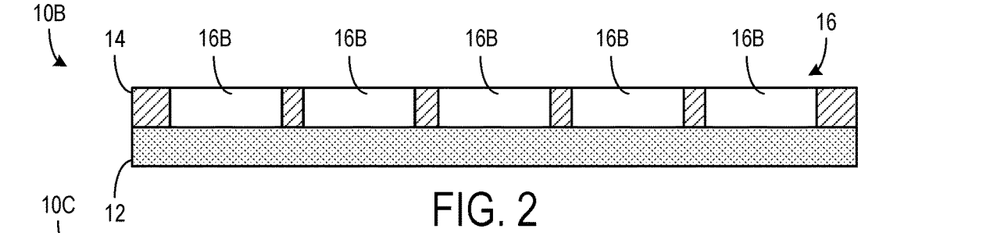
FIG. 2 shows a schematic cross-sectional view of a conformal EMI shielding film according to another example of the present disclosure.

The electrically conductive film layer 14 may have a plurality of voids 16 that are configured to deform during the application of heat and allow the electrically conductive film layer 14 to conform together with the thermal-forming film layer 12. Without the voids 16, for example, the electrically conductive film layer 14 may split where the thermal-forming film layer 12 stretches and crumple where the thermal-forming film layer 12 shrinks. Further, the conformal EMI shielding film 10A may not conform as closely to the underlying components, thereby wasting space in the device. Thus, the voids 16 may impart some additional flexibility to the electrically conductive film layer 14 and the conformal EMI shielding film 10A overall. The voids 16 may take any suitable form. In the illustrated example, the plurality of voids 16 are arranged to form a mesh and include circular voids 16A. Circular voids 16A may be easily manufactured by punching, etc., and reduce the chance of the electrically conductive film layer 14 splitting under stress, for example, at a corner of the void 16. Further, the shape of the voids 16 may affect the way that the conformal EMI shielding film 10A deforms under heat, and therefore FIG. 2 shows a schematic cross-sectional view of a conformal EMI shielding film 10B according to another example of the present disclosure. Here, also before the application of heat, the plurality of voids 16 may include oblong voids 16B, which may experience some similar benefits as the circular voids 16A.

Figure 3:
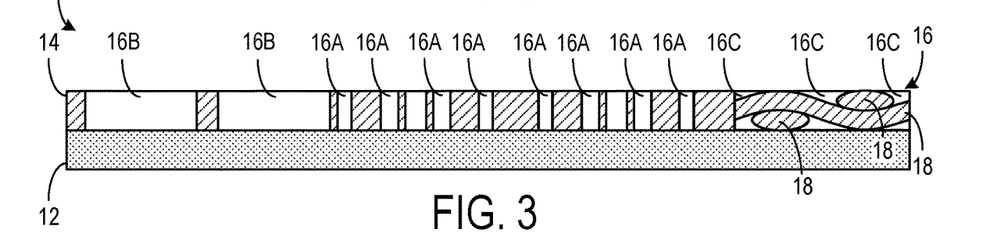
FIG. 3 shows a schematic cross-sectional view of a conformal EMI shielding film according to another example of the present disclosure.

The voids 16 may include a single type of void 16 throughout the entire electrically conductive film layer 14, or the voids 16 may include a variety of different types in a single layer, such as is illustrated in a conformal EMI shielding film 10C in FIG. 3. As illustrated, in addition to the circular voids 16A and the oblong voids 16B, the conformal EMI shielding film 10C includes a region where the electrically conductive film layer 14 is woven. A woven electrically conductive film layer 14 may allow for shrinking and expanding of the overall layer by moving woven strands 18 and increasing and decreasing spaces 16C between the strands 18 rather than stretching or compressing the metal material of the strands 18 itself, which may decrease damage caused by stress applied to the strands 18. Only some of the various types of voids 16A-C are labeled in FIGS. 3 and 4 to avoid crowding the drawings. Allowing for different shapes of voids 16 such as the circular voids 16A, oblong voids 16B, or the spaces 16C between the strands 18 increases the design flexibility of the conformal EMI shielding film 10C. Any suitable combination of void 16 types may be used according to design constraints, etc.

Figure 4:
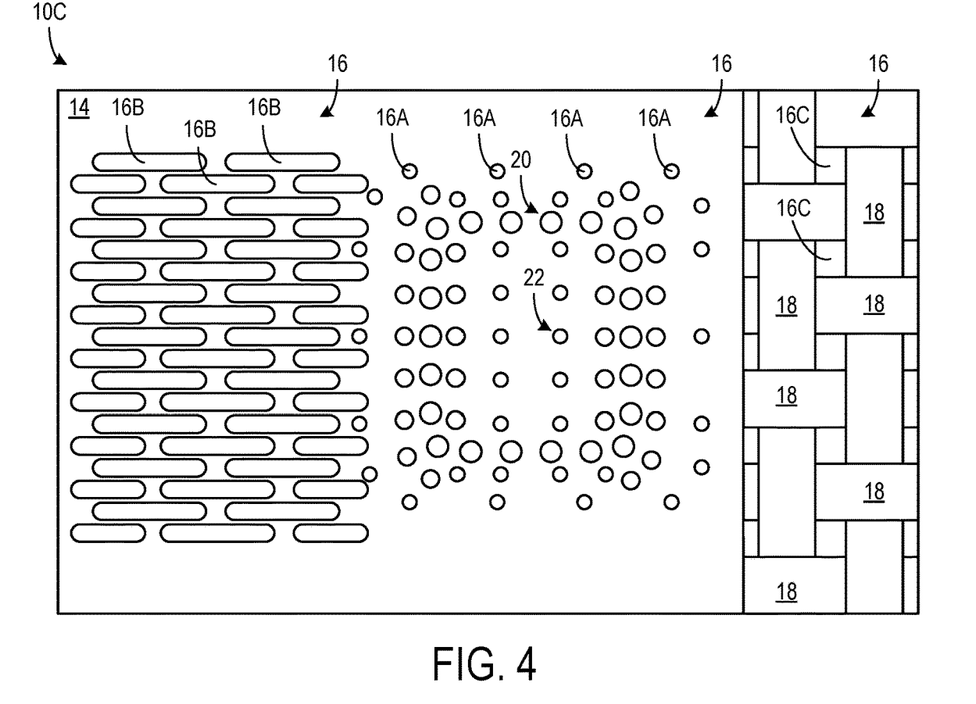
FIG. 4 shows a schematic top view of the conformal EMI shielding film of FIG. 3.

Using the conformal EMI shielding film 10C as an example, FIG. 4 shows a schematic top view illustrating how the pattern of the voids 16 may change across the top surface of the electrically conductive film layer 14. It will be appreciated that the conformal EMI shielding films 10A, 10B may be patterned similarly where appropriate. As shown in FIG. 4, in a first area 20 of the electrically conductive film layer 14, the plurality of voids 16 are formed at a first size, and in a second area 22 of the electrically conductive film layer, the plurality of voids 16 are formed at a second size different than the first size. Here, the voids 16 in the first area 20 are larger than the voids 16 in the second area 22, which may facilitate stretching and shrinking to cover a taller object without causing tears. By contrast, voids 16 may be made smaller, for example, in order to avoid decreasing the EMI shielding capabilities of the conformal EMI shielding film 10C. Furthermore, while the circular voids 16A are shown as having different sizes by way of example, the oblong voids 16B may similarly have different sizes and the spaces 16C in the woven region may also change by changing the distance between strands 18 or strand thickness.

In addition or alternatively to the changing size (e.g., diameter, radius, or length) of the voids 16, in the first area 20 of the electrically conductive film layer, the plurality of voids 16 may be formed at a first density, and in the second area of the electrically conductive film layer, the plurality of voids may be formed at a second density different density than the first density. The density may be expressed as a percentage of void surface area per total area of the electrically conductive film layer 14, for example, the void density in the first area 20 may be approximately 50% while the void density in the second area is approximately 10%. Alternatively, the density may be expressed as the number of discrete voids 16 per surface area. Here, the first density is greater than the second density, which may facilitate stretching and shrinking to cover a taller object without causing tears. A greater density may also spread the voids 16 out over more area compared to having fewer large voids 16, which may decrease the chance of tearing. It will further be appreciated that the density and size of the voids 16 may increase and decrease together, or may increase and decrease independently of each other, according to design constraints. In both the cases of adjusting size and adjusting density, varying the pattern can control local shrinkage and warpage during a form setting process such as a heat-shrinking process. Thus, the local shrinkage and warpage can be controlled to closely conform to the shape of underlying components which allows sufficient space for heat ventilation, provides excellent EMI shielding to targeted areas, and avoids wasting extra metal material at unnecessary locations, lowering both cost and final product weight.

Figure 5A:
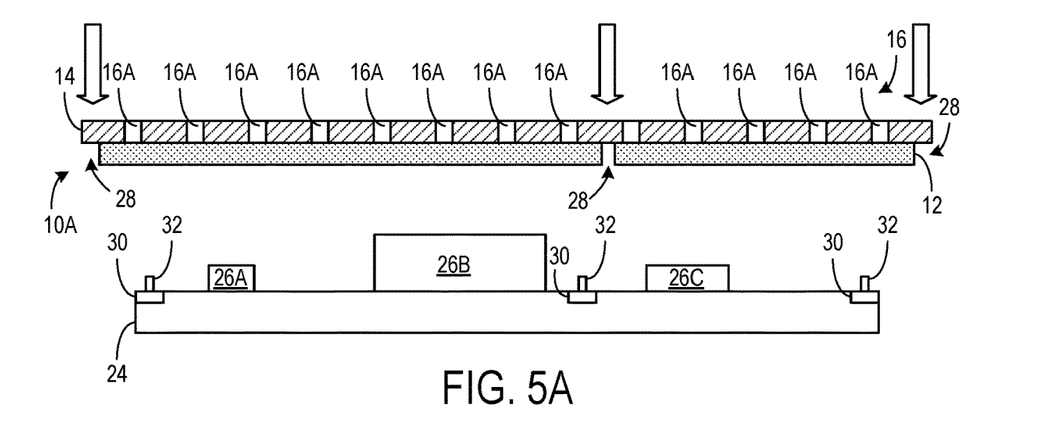
FIG. 5A shows a schematic cross-sectional view of the conformal EMI shielding film of FIG. 1 being applied to a substrate.

FIG. 5A shows a schematic cross-sectional view of a conformal EMI shielding film being applied to a substrate 24, using the conformal EMI shielding film 10A as an example. It will be appreciated that the other conformal EMI shielding films 10B, 10C may be used similarly. It will also be appreciated that the thickness of the conformal EMI shielding film 10A is exaggerated for ease of illustration, and may be approximately 0.06-0.3 mm, where the thermal-forming film layer 12 may be approximately 0.05-0.2 mm thick and the electrically conductive film layer 14 may be approximately 0.01-0.1 mm thick. The total thickness of the conformal EMI shielding film 10A may increase if additional layers are included. Here, the conformal EMI shielding film 10A is being applied to the substrate 24 which may be a printed circuit board (PCB) or other component of an electronic device such as a housing. The thermal-forming film layer 12 may be configured to conformally coat over one or more electronic components 26A-C mounted on the substrate 24 with application of heat, to produce the shielded substrate 24 shown in FIG. 5B. Optionally, the conformal EMI shielding film 10A may be held down at one or more locations such as those illustrated with arrows in FIG. 5A in order to encourage the thermal-forming film layer 12 to conform to the components 26A-C more closely. Additionally or alternatively, a vacuum may be used to suck the conformal EMI shielding film 10A down to the substrate 24 with negative pressure, or positive pressure may be applied to push the conformal EMI shielding film 10A down against the substrate 24. In this manner, the thermal-forming film layer 12 may be activated to conform to the shape of the substrate 24, and the electrically conductive film layer 14 that is sealed to the thermal-forming film layer 12 may be pulled along to conform together with the thermal-forming film layer 12, thereby forming a low-profile EMI shield over the substrate 24.

Figure 5B:
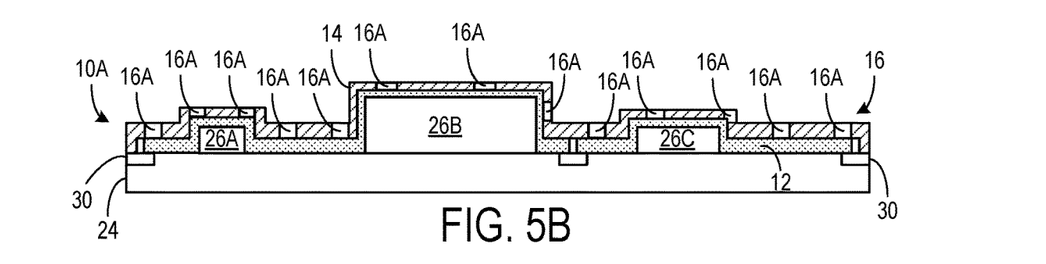
FIG. 5B shows a schematic cross-sectional view of the conformal EMI shielding film of FIG. 1 after being applied to the substrate.

The thermal-forming film layer 12 may include one or more openings 28 to allow contact between the electrically conductive film layer 14 and the substrate 24 when the electrically conductive film layer 14 is formed on an opposite side of the thermal-forming film layer 12 from the substrate 24. For example, the electrically conductive film layer 14 may be grounded via ground pads 30 in the substrate 24, and would be blocked from reaching the ground pads 30 without the openings 28 being formed in the thermal-forming film layer 12. The ground pads 30 may include a locking structure 32 for locking the conformal EMI shielding film 10A in place, which may be surface-mounted technology (SMT).

By way of example, the illustrated components of the substrate 24 include power delivery circuitry 26A, a system-on-a-chip (SoC) 26B, and memory 26C, but it will be appreciated that any appropriate component that would benefit from EMI shielding may be used. These components are different sizes and therefore the conformal EMI shielding film 10A may stretch, shrink, and warp differently around each of them. The thermal-forming film layer 12 may begin oversized when applied to the substrate 24, and then shrink to conform to the shape of the substrate 24 when heated in a heat-shrink process. When covering tall components, the conformal EMI shielding film 10A may be stretched and lose approximately 20% thickness locally after the application of heat. Due to the localized shrinking around the various components 26A-C, the voids 16 change shape, size, and/or density after the application of heat. In the cross-sectional view provided, it can be seen how the various voids 16 no longer have the same thickness or width as in the unheated film, and it will be understood that if the shrinkage is not symmetric in all dimensions, then a given void 16 may shrink more in one direction than another and end up changing from circular to oval in a top view, for example.

Figure 6A:
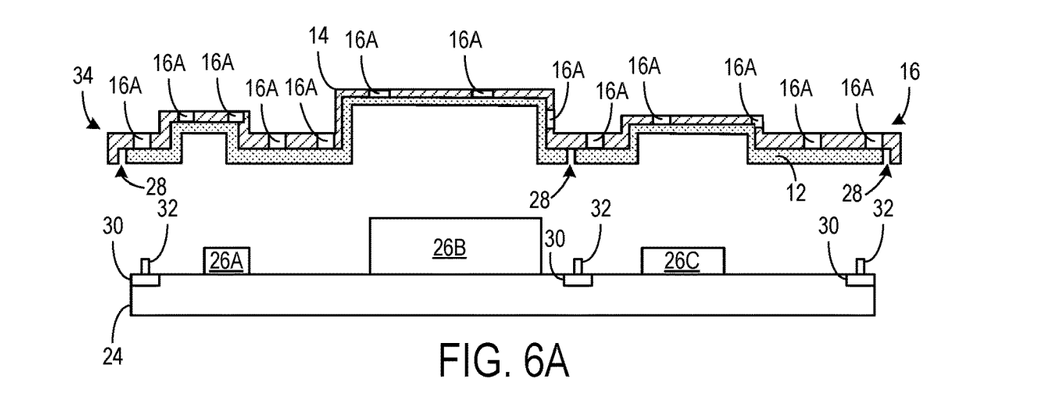
FIG. 6A shows a schematic cross-sectional view of a pre-formed intermediate of the conformal EMI shielding film of FIG. 1 being applied to a substrate.
Figure 6B:
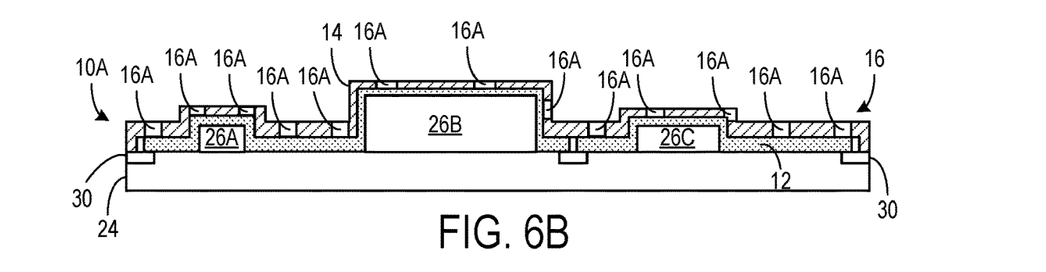
FIG. 6B shows a schematic cross-sectional view of the pre-formed intermediate of the conformal EMI shielding film of FIG. 1 after being applied to the substrate.

Turning to FIGS. 6A-B, in some cases, it may be preferable to preform a composite 34 of the thermal-forming film layer 12 and the electrically conductive film layer 14 to an intermediate shape before applying the preformed composite 34 to the substrate 24 and applying the heat. The preformed composite 34 may be formed to approximately 80%, for example, of the final shape of the conformal EMI shielding film 10A after the application of heat. Preforming adds another step to the manufacturing process and can be beneficial in some cases when getting the exact final shape desired would be too difficult in one step, for example when covering very tall components. In addition, preforming may increase precision alignment between components on the substrate 24 and the conformal EMI shielding film 10A and therefore may provide a good electrical connection between the locking structure 32 and openings 28. In some cases, the final desired design of the conformal EMI shielding film 10A may be too thick to easily conform to the profile of the components being covered with the application of heat alone, and therefore preforming may allow the application of heat to the preformed composite 34 to result in the desired final shape.

Figure 7A:
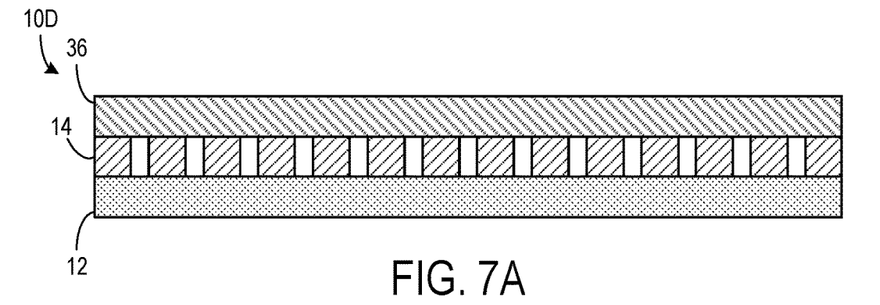
FIGS. 7A-7B show schematic cross-sectional views of a conformal EMI shielding film including a third layer according to another example of the present disclosure.
Figure 7B:
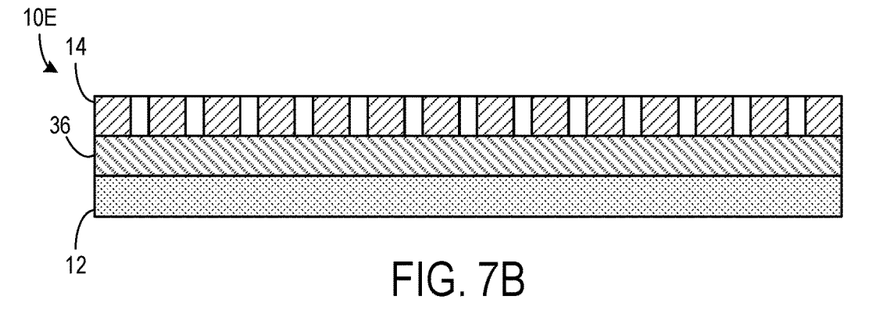
Figure 8:
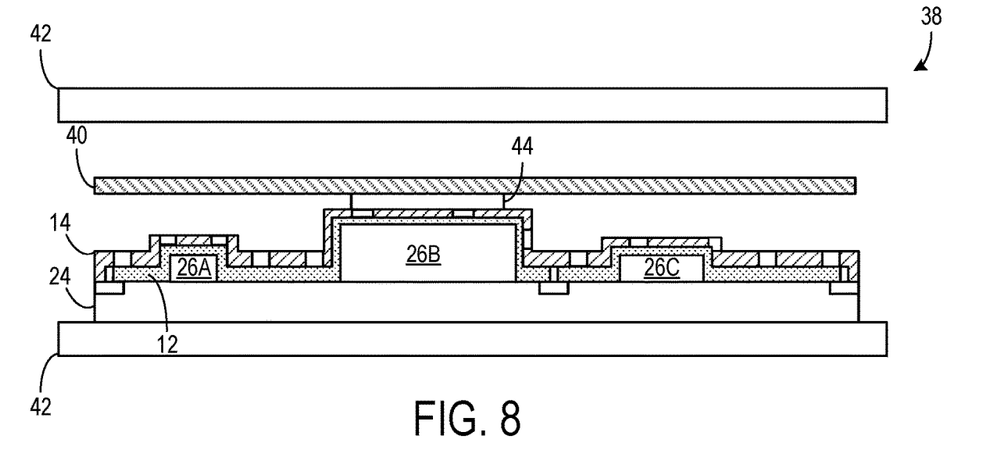
FIG. 8 shows an EMI shielded circuit board including the conformal EMI shielding film of FIG. 1 and a heat pipe.

FIGS. 7A-B show schematic cross-sectional views of a conformal EMI shielding film 10D, 10E including a third layer 36 according to another example of the present disclosure. The third layer 36 may be added to the electrically conductive film layer 14 (FIG. 7A) or between the electrically conductive film layer 14 and the thermal-forming film layer 12 (FIG. 7B). In the example of FIG. 7A, the third layer 36 may be a cosmetic layer to improve appearance, a protective layer to decrease the risk of damage to the substrate 24 and components 26A-C, or a thermal spreading layer configured to conduct heat. In the case of the thermal spreading layer, the third layer 36 may increase heat dispersion from the covered components 26A-C to maintain acceptable performance levels. Similarly, FIG. 8 shows an EMI-shielded circuit board 38 including the conformal EMI shielding film 10A and a heat pipe 40, mounted within a chassis 42 of an electronic device. The heat pipe 40 may be placed over a relatively high heat producing component such as the SoC 26B in order to increase the heat drawn away from the SoC 26B via a thermal interface material (TIM) layer 44. The heat pipe 40 may be a heat spreader such as graphite to disperse the heat along the extent of the heat pipe 40 for increased heat transfer away from the SoC 26B. If the electronic device is actively cooled, then airflow over the heat pipe 40 may increase cooling of the SoC 26B and the electronic device as a whole.

Figure 9:
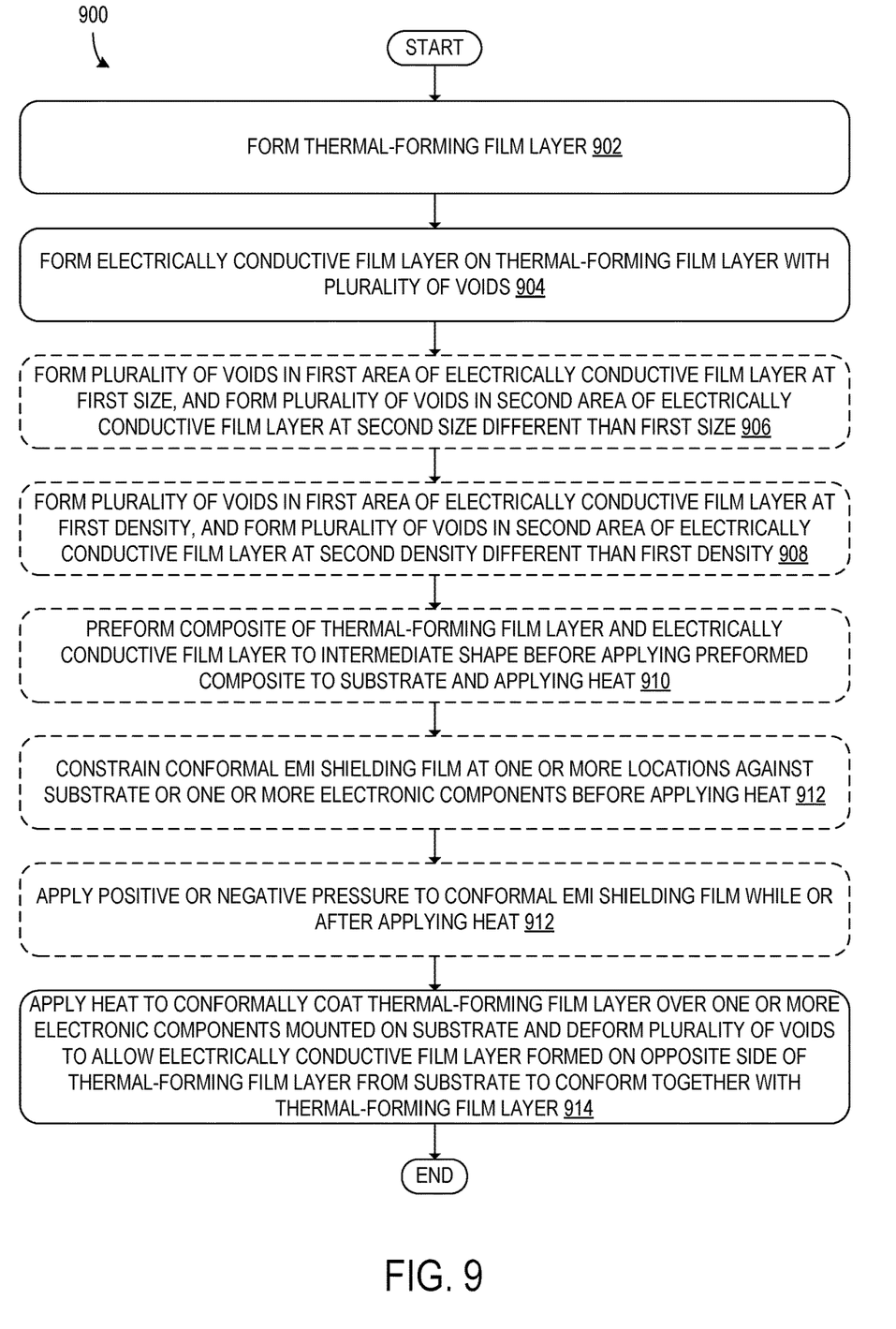
FIG. 9 shows an example flowchart for a method for manufacturing a conformal EMI shielding film.

FIG. 9 shows an example flowchart for a method 900 for manufacturing a conformal EMI shielding film. The method 900 may be implemented in the manufacture of the conformal EMI shielding films 10A-C illustrated in FIGS. 1-3. At 902, the method 900 may include forming a thermal-forming film layer. The thermal-forming film layer may be heat activated to shrink to a desired shape and act as a carrier. At 904, the method 900 may include forming an electrically conductive film layer on the thermal-forming film layer with a plurality of voids. The electrically conductive film layer may provide an EMI shielding property to protect one or more electronic components from the noise effects of EMI. In some instances, forming the electrically conductive film layer includes metallic ink printing, physical vapor deposition, or lamination. Accordingly, an appropriate method for forming the electrically conductive film layer may be chosen from among different options. At 906, the method 900 may include forming the plurality of voids in a first area of the electrically conductive film layer at a first size, and forming the plurality of voids in a second area of the electrically conductive film layer at a second size different than the first size. Additionally or alternatively, at 908, the method 900 may include forming the plurality of voids in a first area of the electrically conductive film layer at a first density, and forming the plurality of voids in a second area of the electrically conductive film layer at a second density different than the first density. Varying the void size and/or density may direct the shrinking and warping of the conformal EMI shielding film in order to arrive at a desired shape. Before the application of heat, the plurality of voids may include circular voids or oblong voids, or the electrically conductive film layer may be woven, among other options. In this manner, the void shapes may be selected from various options so that an appropriate shape is utilized depending on design constraints.

At 910, the method 900 may optionally include preforming a composite of the thermal-forming film layer and the electrically conductive film layer to an intermediate shape before applying the preformed composite to the substrate and applying the heat. Preforming may help some final shapes to be achieved more easily than forming the final shape in a single step. At 912, the method 900 may optionally include constraining the conformal EMI shielding film at one or more locations against a substrate or one or more electronic components before applying the heat. These points of constraint may help keep the conformal EMI shielding film tightly conformed to the substrate during the heat process, for example, near tall vertical surfaces, edges of the shielded area, or in crevices. Another way to increase conformity of the conformal EMI shielding film is at 914, where the method 900 may optionally include applying positive or negative pressure to the conformal EMI shielding film while or after applying the heat.

Finally, at 916, the method 900 may include applying heat to conformally coat the thermal-forming film layer over the one or more electronic components mounted on the substrate and deform the plurality of voids to allow the electrically conductive film layer formed on an opposite side of the thermal-forming film layer from the substrate to conform together with the thermal-forming film layer.

In this manner, the thermal-forming film layer is used as a heat-activated carrier to move the electrically conductive film layer close to the electronic components and substrate to thereby create a low-profile EMI shield that exhibits good EMI shielding performance while not taking up a large three-dimensional footprint or blocking airflow. The voids change shape as the electrically conductive film layer moves to allow movement without stress-induced tearing or excessive bunching. A simulated device under testing using the EMI shielding techniques described herein exhibited a noise reduction of approximately 70 dB.

In some embodiments, the methods and processes described herein may be tied to a computing system of one or more computing devices. In particular, such methods and processes may be implemented as a computer-application program or service, an application-programming interface (API), a library, and/or other computer-program product.

Figure 10:
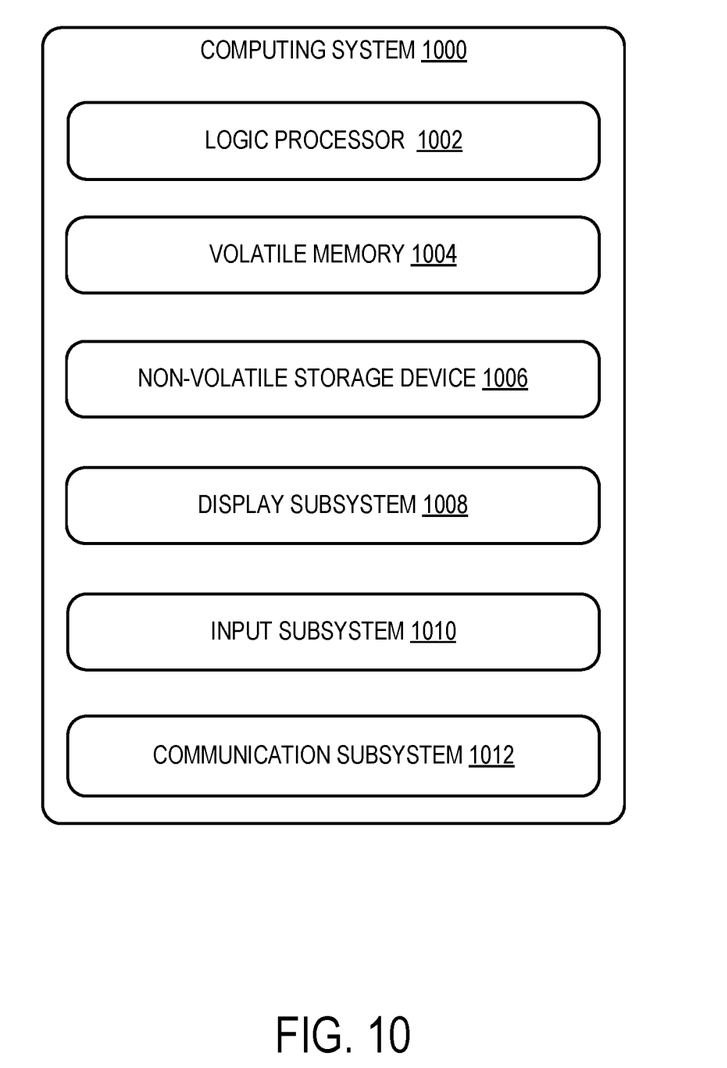
FIG. 10 shows a schematic view of an example computing environment in which the conformal EMI shielding film of FIGS. 1-3 may be included.

FIG. 10 schematically shows a non-limiting embodiment of a computing system 1000 that can be the subject of one or more of the methods and processes described above. Computing system 1000 is shown in simplified form. Computing system 1000 may embody an electronic device including the conformal EMI shielding film 10A-C described above and illustrated in FIGS. 1-3 or the EMI shielded circuit board shown in FIG. 8. Computing system 1000 may take the form of one or more personal computers, server computers, tablet computers, home-entertainment computers, network computing devices, gaming devices, mobile computing devices, mobile communication devices (e.g., smartphone), and/or other computing devices, and wearable computing devices such as smart wristwatches and head mounted augmented reality devices.

Computing system 1000 includes a logic processor 1002 volatile memory 1004, and a non-volatile storage device 1006. Computing system 1000 may optionally include a display subsystem 1008, input subsystem 1010, communication subsystem 1012, and/or other components not shown in FIG. 10.

Logic processor 1002 includes one or more physical devices configured to execute instructions. For example, the logic processor may be configured to execute instructions that are part of one or more applications, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more physical processors (hardware) configured to execute software instructions. Additionally or alternatively, the logic processor may include one or more hardware logic circuits or firmware devices configured to execute hardware-implemented logic or firmware instructions. Processors of the logic processor 1002 may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects are run on different physical logic processors of various different machines, it will be understood.

Non-volatile storage device 1006 includes one or more physical devices configured to hold instructions executable by the logic processors to implement various computing functions. When such methods and processes are implemented, the state of non-volatile storage device 1006 may be transformed—e.g., to hold different data.

Non-volatile storage device 1006 may include physical devices that are removable and/or built-in. Non-volatile storage device 1006 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 1006 may include nonvolatile, dynamic, static, read/write, read-only, sequential-access, location-addressable, file-addressable, and/or content-addressable devices. It will be appreciated that non-volatile storage device 1006 is configured to hold instructions even when power is cut to the non-volatile storage device 1006.

Volatile memory 1004 may include physical devices that include random access memory. Volatile memory 1004 is typically utilized by logic processor 1002 to temporarily store information during processing of software instructions. It will be appreciated that volatile memory 1004 typically does not continue to store instructions when power is cut to the volatile memory 1004.

Aspects of logic processor 1002, volatile memory 1004, and non-volatile storage device 1006 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SoC), and complex programmable logic devices (CPLDs), for example.

The following paragraphs provide additional support for the claims of the subject application. One aspect provides a conformal electromagnetic interference (EMI) shielding film, comprising a thermal-forming film layer configured to conformally coat over one or more electronic components mounted on a substrate with application of heat, and an electrically conductive film layer formed on an opposite side of the thermal-forming film layer from the substrate and having a plurality of voids that are configured to deform during the application of heat and allow the electrically conductive film layer to conform together with the thermal-forming film layer. In this aspect, additionally or alternatively, in a first area of the electrically conductive film layer, the plurality of voids are formed at a first size, and in a second area of the electrically conductive film layer, the plurality of voids are formed at a second size different than the first size. In this aspect, additionally or alternatively, in a first area of the electrically conductive film layer, the plurality of voids are formed at a first density, and in a second area of the electrically conductive film layer, the plurality of voids are formed at a second density different density than the first density. In this aspect, additionally or alternatively, before the application of heat, the plurality of voids include circular voids. In this aspect, additionally or alternatively, before the application of heat, the plurality of voids include oblong voids. In this aspect, additionally or alternatively, the electrically conductive film layer is woven. In this aspect, additionally or alternatively, the electrically conductive film layer includes at least one of copper, aluminum, gold, silver, nickel, tin, zinc, magnesium, iron, or alloys thereof. In this aspect, additionally or alternatively, the thermal-forming film layer includes at least one of polyethylene terephthalate, ethylene vinyl acetate, polyvinyl chloride, polystyrene, acrylonitrile butadiene styrene, acrylic, cellulose acetate butyrate, polycarbonate, polysulfone, or combinations thereof. In this aspect, additionally or alternatively, the conformal EMI shield further comprises a thermal spreading layer configured to conduct heat.

Another aspect provides a method for manufacturing a conformal electromagnetic interference (EMI) shielding film. The method comprises forming a thermal-forming film layer, forming an electrically conductive film layer on the thermal-forming film layer with a plurality of voids, and applying heat to conformally coat the thermal-forming film layer over one or more electronic components mounted on a substrate and deform the plurality of voids to allow the electrically conductive film layer formed on an opposite side of the thermal-forming film layer from the substrate to conform together with the thermal-forming film layer. In this aspect, additionally or alternatively, the method further comprises forming the plurality of voids in a first area of the electrically conductive film layer at a first size, and forming the plurality of voids in a second area of the electrically conductive film layer at a second size different than the first size. In this aspect, additionally or alternatively, the method further comprises forming the plurality of voids in a first area of the electrically conductive film layer at a first density, and forming the plurality of voids in a second area of the electrically conductive film layer at a second density different than the first density. In this aspect, additionally or alternatively, before the application of heat, the plurality of voids include circular voids. In this aspect, additionally or alternatively, before the application of heat, the plurality of voids include oblong voids. In this aspect, additionally or alternatively, the electrically conductive film layer is woven. In this aspect, additionally or alternatively, the method further comprises preforming a composite of the thermal-forming film layer and the electrically conductive film layer to an intermediate shape before applying the preformed composite to the substrate and applying the heat. In this aspect, additionally or alternatively, forming the electrically conductive film layer includes metallic ink printing, physical vapor deposition, or lamination. In this aspect, additionally or alternatively, the method further comprises constraining the conformal EMI shielding film at one or more locations against the substrate or the one or more electronic components before applying the heat. In this aspect, additionally or alternatively, the method further comprises applying positive or negative pressure to the conformal EMI shielding film while or after applying the heat.

Another aspect provides an electromagnetic interference (EMI) shielded circuit board, comprising a circuit board including one or more electronic components mounted on a substrate, and a conformal EMI shielding film. The conformal EMI shielding film includes a thermal-forming film layer configured to conformally coat over the one or more electronic components with application of heat, and an electrically conductive film layer formed on an opposite side of the thermal-forming film layer from the substrate and having a plurality of voids that are configured to deform during the application of heat and allow the electrically conductive film layer to conform together with the thermal-forming film layer.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:

1. A conformal electromagnetic interference (EMI) shielding film, comprising: a thermal-forming film layer configured to conformally coat over one or more electronic components mounted on a substrate with application of heat; and an electrically conductive film layer formed on an opposite side of the thermal-forming film layer from the substrate and having a plurality of voids that are configured to deform during the application of heat and allow the electrically conductive film layer to conform together with the thermal-forming film layer, wherein in a first area of the electrically conductive film layer, the plurality of voids are formed at a first density, and in a second area of the electrically conductive film layer, the plurality of voids are formed at a second density different density than the first density.

2. The conformal EMI shield of claim 1, wherein in a first area of the electrically conductive film layer, the plurality of voids are formed at a first size, and in a second area of the electrically conductive film layer, the plurality of voids are formed at a second size different than the first size.

3. The conformal EMI shield of claim 1, wherein before the application of heat, the plurality of voids include circular voids.

4. The conformal EMI shield of claim 1, wherein before the application of heat, the plurality of voids include oblong voids.

5. The conformal EMI shield of claim 1, wherein the electrically conductive film layer is woven.

6. The conformal EMI shield of claim 1, wherein the electrically conductive film layer includes at least one of copper, aluminum, gold, silver, nickel, tin, zinc, magnesium, iron, or alloys thereof.

7. The conformal EMI shield of claim 1, wherein the thermal-forming film layer includes at least one of polyethylene terephthalate, ethylene vinyl acetate, polyvinyl chloride, polystyrene, acrylonitrile butadiene styrene, acrylic, cellulose acetate butyrate, polycarbonate, polysulfone, or combinations thereof.

8. The conformal EMI shield of claim 1, further comprising a thermal spreading layer configured to conduct heat.

9. A method for manufacturing a conformal electromagnetic interference (EMI) shielding film, the method comprising: forming a thermal-forming film layer; forming an electrically conductive film layer on the thermal-forming film layer with a plurality of voids; and applying heat to conformally coat the thermal-forming film layer over one or more electronic components mounted on a substrate and deform the plurality of voids to allow the electrically conductive film layer formed on an opposite side of the thermal-forming film layer from the substrate to conform together with the thermal-forming film layer, further comprising forming the plurality of voids in a first area of the electrically conductive film layer at a first density, and forming the plurality of voids in a second area of the electrically conductive film layer at a second density different than the first density.

10. The method of claim 9, further comprising forming the plurality of voids in a first area of the electrically conductive film layer at a first size, and forming the plurality of voids in a second area of the electrically conductive film layer at a second size different than the first size.

11. The method of claim 9, wherein before the application of heat, the plurality of voids include circular voids.

12. The method of claim 9, wherein before the application of heat, the plurality of voids include oblong voids.

13. The method of claim 9, wherein the electrically conductive film layer is woven.

14. The method of claim 9, further comprising preforming a composite of the thermal-forming film layer and the electrically conductive film layer to an intermediate shape before applying the preformed composite to the substrate and applying the heat.

15. The method of claim 9, wherein forming the electrically conductive film layer includes metallic ink printing, physical vapor deposition, or lamination.

16. The method of claim 9, further comprising constraining the conformal EMI shielding film at one or more locations against the substrate or the one or more electronic components before applying the heat.

17. The method of claim 9, further comprising applying positive or negative pressure to the conformal EMI shielding film while or after applying the heat.

18. An electromagnetic interference (EMI) shielded circuit board, comprising:
a circuit board including one or more electronic components mounted on a substrate; and
a conformal EMI shielding film including:
a thermal-forming film layer configured to conformally coat over the one or more electronic components with application of heat; and
an electrically conductive film layer formed on an opposite side of the thermal-forming film layer from the substrate and having a plurality of voids that are configured to deform during the application of heat and allow the electrically conductive film layer to conform together with the thermal-forming film layer.

* * * * *